(12) United States Patent
Basu et al.

(10) Patent No.: US 8,933,434 B2
(45) Date of Patent: Jan. 13, 2015

(54) ELEMENTAL SEMICONDUCTOR MATERIAL CONTACT FOR GAN-BASED LIGHT EMITTING DIODES

(71) Applicant: International Business Machines Corporation, Armonk, NY (US)

(72) Inventors: Anirban Basu, Elmsford, NY (US); Bahman Hekmatshoartabari, White Plains, NY (US); Davood Shahrjerdi, White Plains, NY (US)

(73) Assignee: International Business Machines Company, Armonk, NY (US)

( * ) Notice: Subject to any disclaimer, the term of this patent is extended or adjusted under 35 U.S.C. 154(b) by 0 days.

(21) Appl. No.: 13/897,508

(22) Filed: May 20, 2013

(65) Prior Publication Data

US 2014/0339503 A1 Nov. 20, 2014

(51) Int. Cl.
*H01L 33/06* (2010.01)
*H01L 29/15* (2006.01)
(Continued)

(52) U.S. Cl.
CPC ............ *H01L 33/06* (2013.01); *H01L 33/0075* (2013.01); *H01L 33/32* (2013.01)
USPC ................ 257/21; 257/14; 257/81; 257/91; 257/99; 257/184; 257/E51.019

(58) Field of Classification Search
USPC ...................... 257/14, 21, 80, 81, 91, 99, 184, 257/E51.019
See application file for complete search history.

(56) References Cited

U.S. PATENT DOCUMENTS 5,684,309 A * 11/1997 McIntosh et al. ............. 257/191
5,923,049 A * 7/1999 Bohm et al. .................... 257/55
(Continued)

FOREIGN PATENT DOCUMENTS

CN 102208503 A 10/2011
CN 202094167 U 12/2011
(Continued)

OTHER PUBLICATIONS

Bayram, C. et al., "A hybrid green light-emitting diode comprised of n-ZnO/(InGaN/GaN) multi-quantum-wells/p-GaN" Appl. Phys. Lett. (Aug. 2008) pp. 081111-1-081111-3, vol. 93.
(Continued)

*Primary Examiner* — Thanh V Pham
(74) *Attorney, Agent, or Firm* — Scully, Scott, Murphy & Presser, P.C.; Louis J. Percello, Esq.

(57) ABSTRACT

A vertical stack including a p-doped GaN portion, a multi-quantum-well, and an n-doped GaN portion is formed on an insulator substrate. The p-doped GaN portion may be formed above, or below, the multi-quantum-well. A dielectric material liner is formed around the vertical stack, and is patterned to physically expose a top surface of the p-doped GaN portion. A selective low temperature epitaxy process is employed to deposit a semiconductor material including at least one elemental semiconductor material on the physically exposed surfaces of the p-doped GaN portion, thereby forming an elemental semiconductor material portion. Metallization is performed on a portion of the elemental semiconductor material portions to form an electrical contact structure that provides effective electrical contact to the p-doped GaN portion through the elemental semiconductor material portion. The elemental semiconductor material portion spreads electrical current between the electrical contact structure and the p-doped GaN portion.

18 Claims, 14 Drawing Sheets

(51) Int. Cl.
*H01L 33/00* (2010.01)
*H01L 33/32* (2010.01)

(56) References Cited

U.S. PATENT DOCUMENTS

| | | | |
|---|---|---|---|
| 6,100,106 | A | 8/2000 | Yamaguchi et al. |
| 6,492,660 | B2 * | 12/2002 | Uchida ............ 257/79 |
| 8,198,645 | B2 | 6/2012 | Sakai |
| 2012/0043527 | A1 * | 2/2012 | Ding et al. ............ 257/28 |
| 2012/0295417 | A1 | 11/2012 | Adam et al. |
| 2013/0032779 | A1 | 2/2013 | Huang et al. |

FOREIGN PATENT DOCUMENTS

| | | |
|---|---|---|
| CN | 202189826 U | 4/2012 |
| CN | 202549912 U | 11/2012 |
| CN | 102832302 A | 12/2012 |
| JP | 4889142 | 12/2011 |

OTHER PUBLICATIONS

Yen, K.Y. et al., "Performance of InGaN/GaN MQW LEDs Using Ga-Doped ZnO TCLs Prepared by ALD" IEEE Photonics Technology Letters (Dec. 1, 2012) pp. 2105-2108, vol. 24, No. 23.

Li, W. et atl., "Comparative study of ZnO and GaN films grown by MOCVD" IEEE Proceedings: 7th International Conference on Solid-State and Integrated Circuits Technology (Oct. 18-21, 2004) pp. 2374-2377, vol. 3.

Chen, H.C. et al., "UV Electroluminescence and Structure of n-ZnO/p-GaN Heterojunction LEDs Grown by Atomic Layer Deposition" IEEE Journal of Quantum Electronics (Feb. 2010) pp. 265-271, vol. 46, No. 2.

U.S. Office Action dated May 22, 2014 issued in U.S. Appl. No. 14/019,726.

U.S. Office Action dated May 23, 2014 issued in U.S. Appl. No. 14/019,733.

* cited by examiner

ELEMENTAL SEMICONDUCTOR MATERIAL CONTACT FOR GAN-BASED LIGHT EMITTING DIODES

RELATED APPLICATIONS

The present application is related to copending U.S. patent application Ser. No. 13/897,507, the entire contents of which are incorporated herein by reference.

BACKGROUND

The present disclosure relates to a semiconductor structure, and particularly to a GaN-based light emitting diode employing an elemental semiconductor material contact and methods of manufacturing the same.

Gallium nitride (GaN) is a III-V compound direct band gap semiconductor material having a wide band gap of 3.4 eV, and thus, allows useful applications in various optoelectronic devices. Gallium nitride is commonly used in light-emitting diodes.

However, one of the challenges for the gallium nitride based light emitting diodes is a large contact area required on a p-doped gallium nitride portion as well as limited thermal budget for formation of metalized contacts after formation of a multi-quantum-well structure. The large area requirement for a contact to a p-doped gallium nitride portion makes it difficult to provide a high-efficiency gallium nitride based light emitting diodes because the opaque metallic material employed for the contact to the p-doped gallium nitride portion blocks a significant portion of light emission from the multi-quantum-well in the light emitting diode.

Specifically, because a p-type gallium nitride material does not provide high conductivity, electrical current does not spread well within a p-doped gallium nitride portion of a light emitting diode. In order to enhance light emission from a multi-quantum-well, therefore, a contact structure to the p-doped gallium nitride portion needs to provide sufficient current spreading. A high degree of current spreading can enhance light emission by minimizing the turn-on voltage and by reducing the series resistance within the light emitting diode. However, the contact structure to the p-doped gallium nitride portion includes a metallic material that blocks light emission from the multi-quantum-well, thereby decreasing the efficiency of the gallium nitride-based light emitting diode.

SUMMARY

A vertical stack including a p-doped GaN portion, a multi-quantum-well, and an n-doped GaN portion is formed on an insulator substrate. The p-doped GaN portion may be formed above, or below, the multi-quantum-well. A dielectric material liner is formed around the vertical stack, and is patterned to physically expose a top surface of the p-doped GaN portion. A selective low temperature epitaxy process is employed to deposit a semiconductor material including at least one elemental semiconductor material on the physically exposed surfaces of the p-doped GaN portion, thereby forming an elemental semiconductor material portion. Metallization is performed on a portion of the elemental semiconductor material portions to form an electrical contact structure that provides effective electrical contact to the p-doped GaN portion through the elemental semiconductor material portion. The elemental semiconductor material portion spreads electrical current between the electrical contact structure and the p-doped GaN portion.

According to an aspect of the present disclosure, a semiconductor structure includes a vertical stack located on a substrate. The vertical stack includes, from bottom to top, a first GaN portion having a doping of a first conductivity type, a multi-quantum well located on the first GaN portion, and a second GaN portion located on the multi-quantum well and having a doping of a second conductivity type that is the opposite of the first conductivity type. One of the first and second GaN portions is a p-doped GaN portion. The semiconductor structure further includes an elemental semiconductor material portion. The elemental semiconductor material portion includes at least one elemental semiconductor material and in contact with a surface of the p-doped GaN portion.

According to another aspect of the present disclosure, a method of forming a semiconductor structure is provided. A vertical stack is formed on a substrate. The vertical stack includes, from bottom to top, a first GaN portion having a doping of a first conductivity type, a multi-quantum well located on the first GaN portion, and a second GaN portion located on the multi-quantum well and having a doping of a second conductivity type that is the opposite of the first conductivity type. One of the first and second GaN portions is a p-doped GaN portion. An elemental semiconductor material portion is formed directly on a surface of the p-doped GaN portion. The elemental semiconductor material portion includes at least one elemental semiconductor material.

DETAILED DESCRIPTION

Figure 1A:
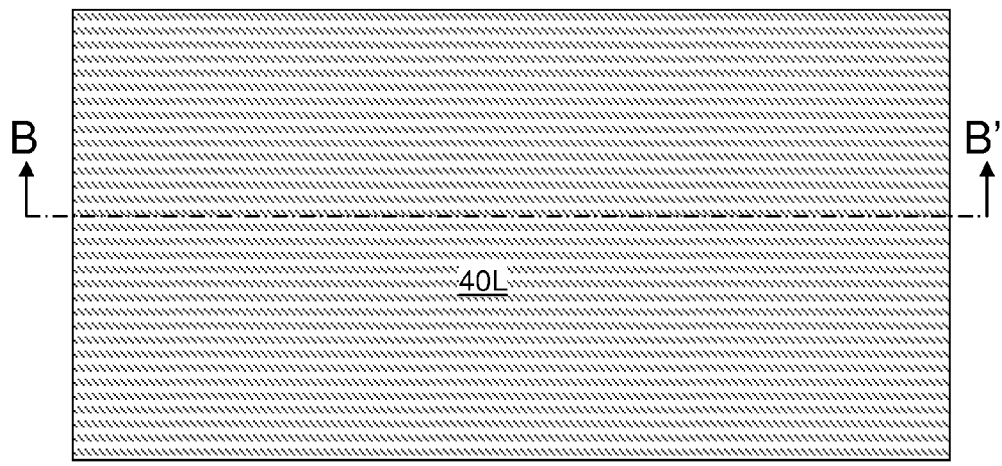
FIG. 1A is a top-down view of a first exemplary semiconductor structure after formation of a stack, from bottom to top, of a first GaN layer, a multi-quantum well layer, and a second GaN layer on a substrate according to a first embodiment of the present disclosure.

As stated above, the present disclosure relates to particularly to a GaN-based light emitting diode employing an elemental semiconductor material contact and methods of manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

As used herein, a quantum well refers to a thin layer which can confine particles or quasiparticles (such as electrons and holes) in a dimension perpendicular to the layer surface, whereas the movement in the other dimensions is not restricted.

As used herein, a multi-quantum-well refers to a plurality of quantum wells adjoined to one another.

As used herein, a periodic multi-quantum-well refers to a multi-quantum-well in which component quantum wells are arranged in a one-dimensional periodic array.

Figure 1B:
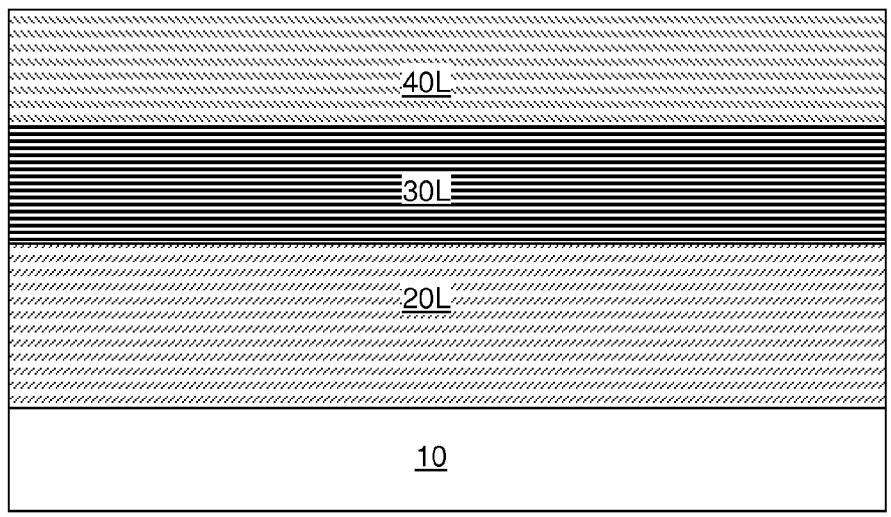
FIG. 1B is a vertical cross-sectional view of the first exemplary semiconductor structure along a vertical plane B-B' of FIG. 1A.

Referring to FIGS. 1A and 1B, a first exemplary semiconductor structure according to a first embodiment of the present disclosure includes a substrate 10 and a stack of material layers formed thereupon. The substrate 10 can be an insulator substrate or an intrinsic compound semiconductor substrate having a high enough resistivity to suppress leakage currents therethrough. For example, if the substrate 10 is an intrinsic compound semiconductor substrate, the resistivity of the substrate 10 can be greater than $10^3$ Ohm-cm at 300K. In one embodiment, the substrate 10 can be a single crystalline insulator substrate or a single crystalline intrinsic compound semiconductor substrate. In one embodiment, the substrate 10 can be a material on which gallium nitride can be epitaxially grown. In one embodiment, the substrate 10 can be a single crystalline sapphire ($Al_2O_3$) substrate, a single crystalline zinc oxide substrate, or a single crystalline silicon carbide substrate. The thickness of the substrate 10 can be selected so as to be able to provide mechanical support to a semiconductor device to be formed thereupon. In one embodiment, the thickness of the substrate 10 can be in a range from 30 microns to 1 mm, although lesser and greater thicknesses can also be employed.

The stack of material layers can include, from bottom to top, a first GaN layer 20L, a multi-quantum well layer 30L, and a second GaN layer 40L. In one embodiment, the first GaN layer 20L, the multi-quantum well layer 30L, and the second GaN layer 40L can be single crystalline, and can be formed with epitaxial alignment to the single crystalline structure of the substrate 10. Thus, the entirety of the first GaN layer 20L, the multi-quantum well layer 30L, the second GaN layer 40L, and the substrate 10 can be single crystalline, i.e., all atoms in the first GaN layer 20L, the multi-quantum well layer 30L, the second GaN layer 40L, and the substrate 10 can be in epitaxial alignment among one another other than crystallographic defects that are ordinarily found in typical single crystalline materials.

Each of the material layers in the first GaN layer 20L, the multi-quantum well layer 30L, the second GaN layer 40L can be deposited, for example, by metalorganic chemical vapor deposition (MOCVD). Alternately, other deposition methods such as molecular beam epitaxy (MBE) may be used.

The first GaN layer 20L includes a first doped single crystalline GaN material. The type of doping of the first GaN layer 20L is herein referred to as a first conductivity type. The first conductivity type is p-type in the first embodiment. The thickness of the first GaN layer 20L can be in a range from 10 nm to 1,000 nm, although lesser and greater thicknesses can also be employed. The first GaN layer 20L can consist essentially of single crystalline GaN material and the p-type dopants therein.

The multi-quantum well layer 30L includes a one-dimensional periodic array of a bilayer unit structure. The bilayer unit structure includes a layer of first compound semiconductor material and a layer of a second compound semiconductor material. Each bilayer unit structure is a quantum well. The multi-quantum well layer 30L constitutes a multi-quantum well in which the bilayer unit structures are arranged in a one-dimensional periodic array as component quantum wells. The entirety of the multi-quantum well layer 30L is formed with epitaxial alignment to the first GaN layer 20L.

In one embodiment, the first compound semiconductor material can be selected from $In_xGa_{1-x}N$, $Al_xGa_{1-x}N$, and $In_xAl_yGa_{1-x-y}N$, and the second compound semiconductor material can be selected from GaN, $In_uGa_{1-u}N$, $Al_uGa_{1-u}N$, and $In_uAl_vGa_{1-u-v}N$. The first and second compound semiconductor materials have different compositions. X, y, u, and v are independently selected numbers greater than 0 and less than 1. Each of a sum of the x and the y (i.e., x+y) and a sum of the u and the v (i.e., u+v) is greater than 0 and less than 1.

In a non-limiting illustrative example, the first compound semiconductor material can be $In_xGa_{1-x}N$, and the second compound semiconductor material can be GaN. The value of x can be in a range from 0.15 to 0.35.

In another non-limiting illustrative example, the first compound semiconductor material can be $Al_xGa_{1-x}N$, and the second compound semiconductor material can be GaN. The value of x can be in a range from 0.30 to 0.70.

The periodicity of the multi-quantum well layer 30L, i.e., the thickness of a single bilayer unit structure, can be in a range from 2 nm to 20 nm, although lesser and greater distances can be employed for the periodicity of the multi-quantum well layer 30L. The number of repetitions of the bilayer unit structure can be in a range from 10 to 100, although lesser and greater numbers of repetition can also be employed.

The second GaN layer 40L includes a second doped single crystalline GaN material. The type of doping of the second GaN layer 40L is herein referred to as a second conductivity type. The second conductivity type is n-type in the first embodiment. The thickness of the second GaN layer 40L can be in a range from 10 nm to 1,000 nm, although lesser and greater thicknesses can also be employed. The second GaN layer 40L can consist essentially of single crystalline GaN material and the n-type dopants therein.

Figure 2A:
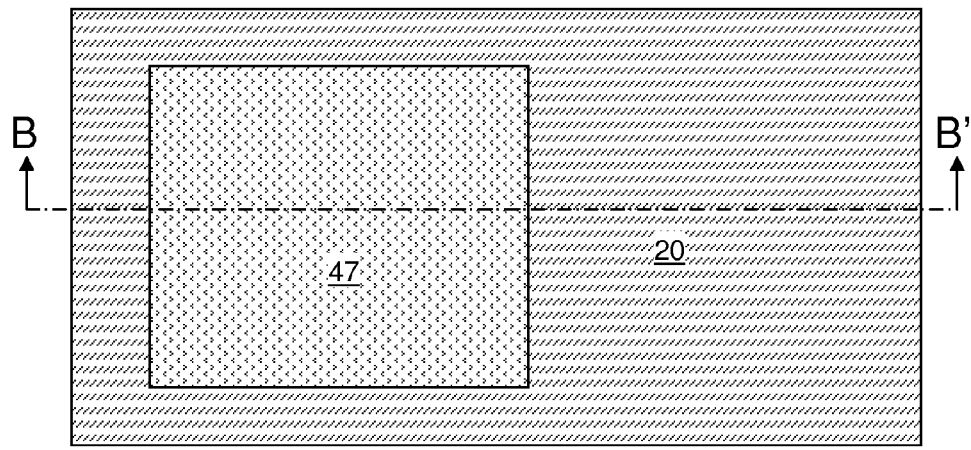
FIG. 2A is a top-down view of the first exemplary semiconductor structure after application and lithographic patterning of a photoresist layer, and transfer of the pattern into the second GaN layer, the multi-quantum well layer, and an upper portion of the first GaN layer according to the first embodiment of the present disclosure.
Figure 2B:
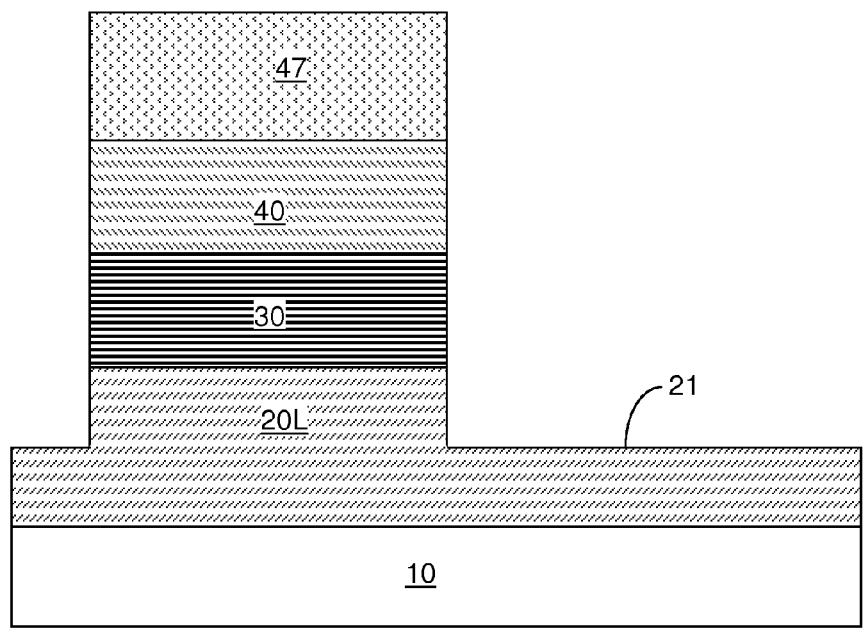
FIG. 2B is a vertical cross-sectional view of the first exemplary semiconductor structure along a vertical plane B-B' of FIG. 2A.

Referring to FIGS. 2A and 2B, a first photoresist layer 47 is applied over the top surface of the second GaN layer 40L, and is lithographically patterned to cover an area within which a stack of material portions is to be subsequently formed. The area covered by the patterned first photoresist layer 47 can be rectangular, circular, elliptical, or otherwise polygonal or of any general closed two-dimensional shape having curved and/or linear edges. The area covered by the patterned first photoresist layer 47 can be determined based on the target level of intensity for emitted light from a light-emitting diode to be subsequently formed with consideration for attenuation by blockage due to a contact structure to be subsequently formed.

The stack including the second GaN layer 40L, the multi-quantum well layer 30L, and the first GaN layer 20L is anisotropically etched down to a height between a first horizontal plane including an interface between the first GaN layer 20L and the substrate 10 and a second horizontal plane including an interface between the first GaN layer 20L and the multi-quantum well layer 30L. The anisotropic etch can be, for example, a reactive ion etch. The pattern in the first photoresist layer 47 can be transferred into the second GaN layer 40L, the multi-quantum well layer 30L, and an upper portion of the first GaN layer 20L by the anisotropic etch. The anisotropic etch can be timed, or controlled in another manner, such that the anisotropic etch stops when a recessed horizontal surface 21 of the first GaN layer 20L is between the first horizontal plane including the interface between the first GaN layer 20L and the substrate 10 and the second horizontal plane including the interface between the first GaN layer 20L and the multi-quantum well layer 30L.

A second GaN portion 40 and a multi-quantum well 30 are formed by the anisotropic etch. The second GaN portion 40 is a remaining portion of the second GaN layer 40L, and the multi-quantum well 30 is a remaining portion of the multi-quantum well layer 30L. After the anisotropic etch, the first GaN layer 20L includes an upper portion and a lower portion. The upper portion of the first GaN layer 20L, the multi-quantum well 30, and the second GaN portion 40 can have a same horizontal cross-sectional area. The upper portion of the first GaN layer 20L, the multi-quantum well 30, and the second GaN portion 40 can include sidewalls that are vertically coincident with one another. As used herein, a group of surfaces is "vertically coincident" with one another if there exists a vertical plane from which the group of surfaces do not device by more than three times the maximum surface roughness of the group of surfaces. The first photoresist layer 47 is subsequently removed, for example, by ashing.

Figure 3A:
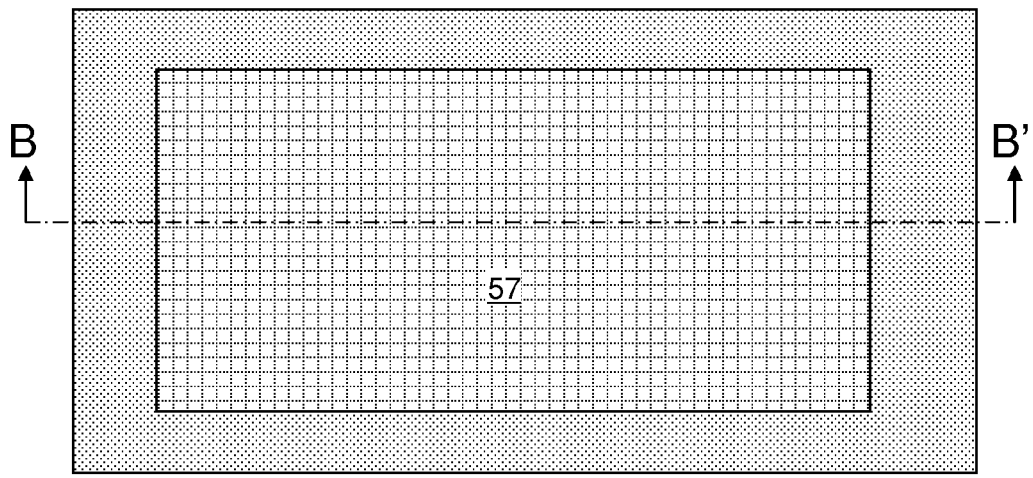
FIG. 3A is a top-down view of the first exemplary semiconductor structure after patterning a lower portion of the first GaN layer according to the first embodiment of the present disclosure.
Figure 3B:
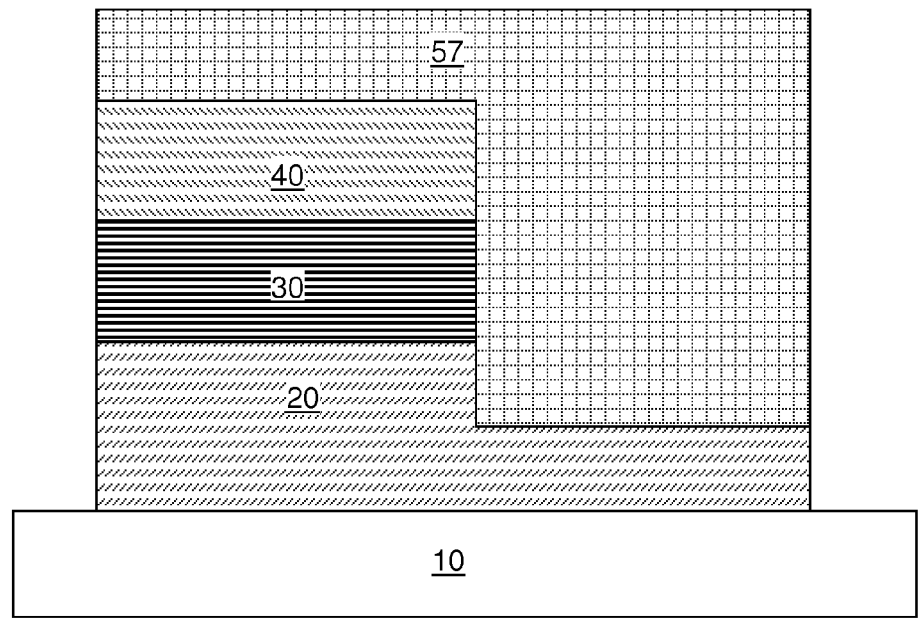
FIG. 3B is a vertical cross-sectional view of the first exemplary semiconductor structure along a vertical plane B-B' of FIG. 3A.

Referring to FIGS. 3A and 3B, a lower portion of the first GaN layer 20L is patterned. The patterning of the lower portion of the first GaN layer 20L can be performed, for example, by applying and lithographically patterning a second photoresist layer 57, and transferring the pattern in the patterned second photoresist layer 57 into the lower portion of the first GaN layer 20L by an anisotropic etch. The area covered by the patterned second photoresist layer 57 includes all of the area of the patterned first photoresist layer 47 and an additional area.

A remaining portion of the first GaN layer 20L after the anisotropic etch is herein referred to as a first GaN portion 20. The first GaN portion 20 includes an upper portion and a lower portion. The upper portion of the first GaN portion 20, the multi-quantum well 30, and the second GaN portion 40 have a same horizontal cross-sectional area. The lower portion of the first GaN portion 20 has a horizontal cross-sectional area that includes all of the same horizontal cross-sectional area and an additional horizontal cross-sectional area. Thus, the first GaN portion 20 is formed by patterning the first GaN layer 20L such that the lower portion (that is located below the horizontal plane including the recessed horizontal surface 21; See FIG. 2B) of the first GaN portion 20 has a horizontal cross-sectional area that includes all of a horizontal cross-sectional area of the upper portion (that is located above the horizontal plane including the recessed horizontal surface 21; See FIG. 2B) of the first GaN portion 20 and an additional horizontal cross-sectional area.

A vertical stack (20, 30, 40) including material portions is formed on the substrate 10. The vertical stack (20, 30, 40) includes, from bottom to top, the first GaN portion 20 having a doping of the first conductivity type, the multi-quantum well 30 located on the first GaN portion 20, and the second GaN portion 40 located on the multi-quantum well 30 and having a doping of the second conductivity type that is the opposite of the first conductivity type. The first GaN portion 20 is a p-doped GaN portion, and the second GaN portion 40 is an n-doped GaN portion. The second photoresist layer 57 is subsequently removed, for example, by ashing.

Figure 4A:
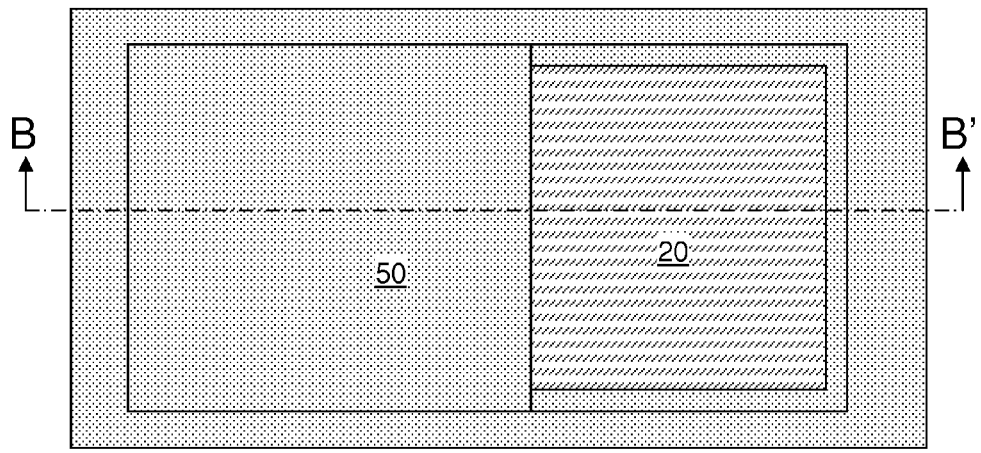
FIG. 4A is a top-down view of the first exemplary semiconductor structure after deposition of a dielectric material liner according to the first embodiment of the present disclosure.
Figure 4B:
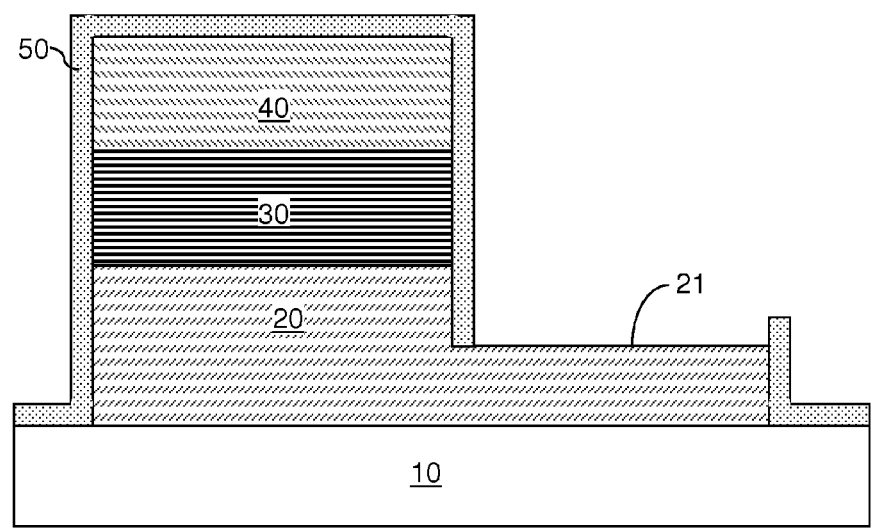
FIG. 4B is a vertical cross-sectional view of the first exemplary semiconductor structure along a vertical plane B-B' of FIG. 4A.

Referring to FIGS. 4A and 4B, a dielectric material liner 50 can be formed on physically exposed surfaces of the vertical stack (20, 30, 40) and physically exposed portions of the top surface of the substrate 10. The dielectric material liner 50 includes a dielectric material such as silicon nitride, silicon oxide, silicon oxynitride, a dielectric metal oxide, a dielectric metal nitride, a dielectric metal oxynitride, or a combination thereof. The dielectric material liner 50 can be deposited, for example, by chemical vapor deposition (CVD) or atomic layer deposition (ALD). The dielectric material liner 50 can be deposited conformally, i.e., such that horizontal portions and vertical portions of the dielectric material liner 50 have substantially the same thickness. The thickness of the dielectric material liner 50, as measured on sidewalls of the vertical stack (20, 30, 40) can be in a range from 3 nm to 100 nm, although lesser and greater thicknesses can also be employed.

A portion of the dielectric material liner 50 can be removed from above the recessed horizontal surface 21 to physically expose a portion of the recessed horizontal surface 21. The physical exposure of a portion of the recessed horizontal surface 21 can be effected, for example, by applying a photoresist layer (not shown), lithographically patterning the photoresist layer to form an opening overlying a portion of the recessed horizontal surface 21, and by etching physically exposed portions of the dielectric material liner 50 from underneath the opening in the patterned photoresist layer by an etch. The etch can be an isotropic etch (such as a wet etch) or an anisotropic etch (such as a reactive ion etch). The patterned photoresist layer is subsequently removed, for example, by ashing. After formation of an opening in the dielectric material liner 50 and physical exposure of a portion of the recessed horizontal surface 21 within the area of the opening in the dielectric material liner 50, the dielectric material liner 50 laterally surrounds the vertical stack (20, 30, 40).

Figure 5A:
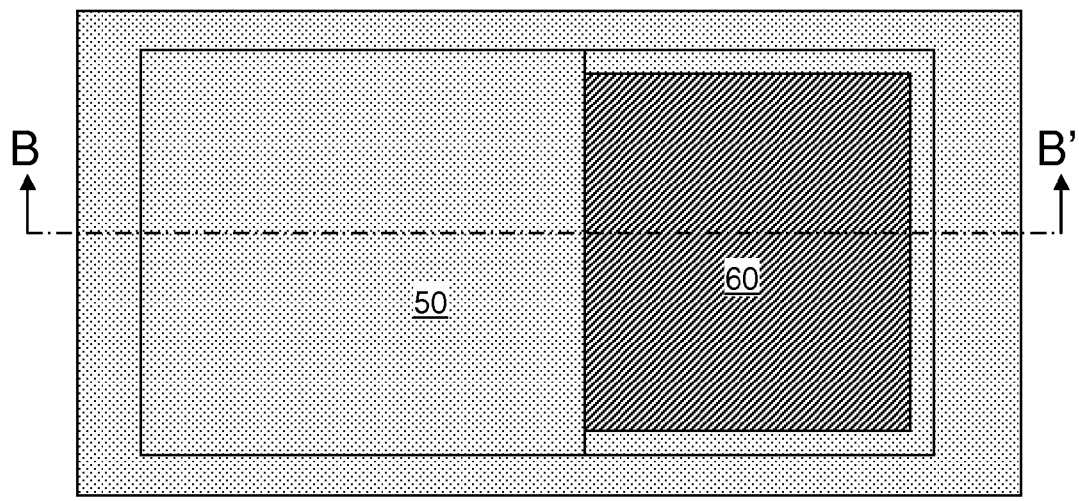
FIG. 5A is a top-down view of the first exemplary semiconductor structure after formation of an opening in the dielectric material liner and formation of an elemental semiconductor material portion on a first GaN portion according to the first embodiment of the present disclosure.
Figure 5B:
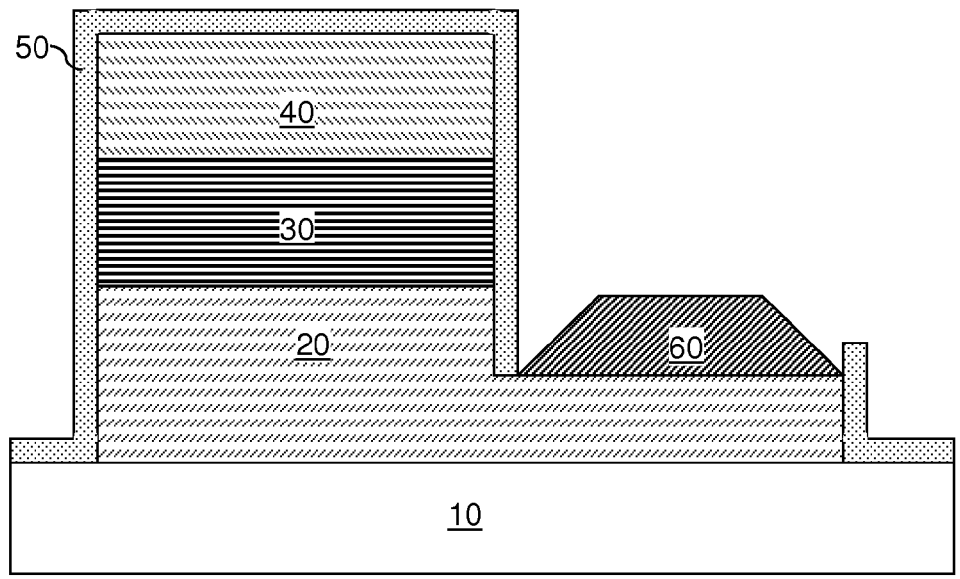
FIG. 5B is a vertical cross-sectional view of the first exemplary semiconductor structure along a vertical plane B-B' of FIG. 5A.

Referring to FIGS. 5A and 5B, at least one elemental semiconductor material is deposited on the physically exposed surface of the first GaN portion 20 by a selective deposition process. As used herein, a selective deposition process refers to a deposition process that deposits a material on surfaces of a first type, while not depositing any material on surfaces of a second type. Specifically, the at least one elemental semiconductor material can be deposited on crystalline surfaces that include physically exposed semiconductor surfaces, while not being deposited on amorphous surfaces such as dielectric surfaces or metallic surfaces. As used herein, a crystalline surface refers to a surface that displays single crystalline or polycrystalline arrangement of atoms. As used herein, an amorphous surface refers to a surface that does not display single crystalline or polycrystalline arrangement of atoms. As used herein, an amorphous surface refers to a surface that does not display single crystalline or polycrystalline arrangement of atoms. An elemental semiconductor material portion 60 including the deposited at least one elemental semiconductor material is formed directly on the physically exposed surface of the first GaN portion 20.

As used herein, an elemental semiconductor material refers to silicon, germanium, and carbon. The at least one elemental semiconductor material can include a single elemental semiconductor element, or can include an alloy of at least two elemental semiconductor elements. Thus, the at least one elemental semiconductor material as deposited can be elemental silicon, elemental germanium, a silicon-germanium alloy, a silicon-carbon alloy, or a silicon-germanium-carbon alloy. The at least one elemental semiconductor material in the elemental semiconductor material portion 60 can be intrinsic, or can be doped with p-type dopants such as B, Ga, or In.

In an exemplary embodiment, the at least one elemental semiconductor material can be a crystalline silicon-and-hydrogen-containing material. The crystalline silicon-and-hydrogen-containing material includes silicon and hydrogen, and can be single-crystalline or polycrystalline. Thus, the elemental semiconductor material portion 60 includes the crystalline silicon-and-hydrogen-containing material.

The crystalline silicon-and-hydrogen-containing material can be deposited, for example, by plasma-enhanced chemical vapor deposition (PECVD) or by hot-wire CVD (HWCVD). The deposition temperature can be in a range from room temperature (i.e., 20° C.) to 450° C. In one embodiment, the crystalline silicon-and-hydrogen-containing material can be deposited at a deposition temperature in a range from 150° C. to 250° C.

If a PECVD process or a HWCVD process is employed to deposit the crystalline silicon-and-hydrogen-containing material, the gas sources (precursor gases) used for the growth of the crystalline silicon-and-hydrogen-containing material may include, but are not limited to, $SiH_4$ (silane), $Si_2H_6$ (disilane), $SiH_2Cl_2$ (dichlorosilane), $SiF_4$ (tetrafluorosilane), and combinations thereof. Hydrogen gas may be employed as a carrier gas (i.e., a dilution gas). In one embodiment, the ratio of the flow rate of the carrier gas to the flow rate of the precursor gas can be greater than 5.

The crystalline silicon-and-hydrogen-containing material can be in-situ doped, for example, by providing a dopant gas in the process chamber. In one embodiment, the dopant gas can be $B_2H_6$ (diborane) or trimethylboron (TMB) for p-type doping. The concentration of activated dopants in the elemental semiconductor material portion 60 can be in a range from $1.0 \times 10^{18}/cm^3$ to $3.0 \times 10^{20}/cm^3$, although lesser and greater concentrations of activated dopants can also be employed. The total concentration of dopants in the elemental semiconductor material portion 60 can be in a range from $1.0 \times 10^{18}/cm^3$ to $1.0 \times 10^{21}/cm^3$, although lesser and greater total concentrations of dopants can also be employed. The content of hydrogen in the deposited crystalline silicon-and-hydrogen-containing material can be in a range from 5 atomic percent to 40 atomic percent, although lesser and greater atomic percentages can also be employed.

The crystalline silicon-and-hydrogen-containing material may additionally contain germanium (Ge), nitrogen (N), oxygen (O), fluorine (F), deuterium (D), chlorine (Cl), carbon (C) and/or combinations thereof. The gas source employed for incorporating germanium can be, for example, germane ($GeH_4$). The gas source employed for incorporating carbon can be, for example, methane ($CH_4$), ethylene ($C_2H_4$), propylene ($C_3H_6$), and other hydrocarbon gases having a formula of $C_xH_y$, in which x is an integer greater than 1, and y is not greater than 2x+2.

In one embodiment, selective growth of the crystalline silicon-and-hydrogen-containing material may be obtained by in-situ etching of non-crystalline (i.e., amorphous) silicon-and-hydrogen-containing material in a hydrogen ($H_2$)

plasma. An etching process of the amorphous silicon-and-hydrogen-containing material is employed to concurrently form epitaxial silicon-and-hydrogen-containing material on exposed single crystalline surfaces of the first GaN portion 20. It should be understood that the epitaxial growth and etching may be performed sequentially or concurrently as needed.

In a non-limiting illustrative example, the crystalline silicon-and-hydrogen-containing material can be deposited at a pressure of about 500 mTorr, at a ratio of $H_2$ flow rate to $SiH_4$ flow rate of about 14, and at a power density of about 4 $mW/cm^2$. A $H_2$ plasma etch can be performed at a temperature of about 150° C. at about 900 mTorr, resulting in an etch selectivity of approximately 1:3 for the crystalline silicon-and-hydrogen-containing material with respect to an amorphous silicon-and-hydrogen-containing material. It should be understood that the amorphous silicon-and-hydrogen-containing material grown on the gate electrode 50, the shallow trench isolation structures 32, and the dielectric material layer 40 are etched using a plasma of a gas, which can be one or a combination of $H_2$, HCl, $CL_2$, Ar, etc. The epitaxial deposition and the plasma etch may be performed sequentially or concurrently in a same chamber. The selective epitaxial growth can be achieved either by alternating gas pulses responsible for the epitaxial growth (e.g., silane and dopant species) and the etch (plasma etchants.) or by simultaneous flow of all the gases. Further details regarding the epitaxial growth and selective removal process are described in U.S. Patent Application Publication No. 2012/0210932 to Hekmatshoar-Tabari published on Aug. 23, 2012, the entire contents of which are incorporated herein by reference.

Thus, the elemental semiconductor material portion 60 is formed by selectively depositing the at least one elemental semiconductor material on the physically exposed surface of the first GaN portion 20. A bottom surface of the elemental semiconductor material portion 60 can be in contact with the single crystalline p-doped gallium nitride material of the first GaN portion 20. The elemental semiconductor material portion 60 contacts a horizontal surface (e.g., the recessed horizontal surface 21 illustrated in FIG. 2B) of the first GaN portion 20 such that the horizontal surface is located between the first horizontal plane including the interface between the first GaN portion 20 and the substrate 10 and the second horizontal plane including the interface between the first GaN portion 20 and the multi-quantum well 30. In other words, the height of the horizontal surface of the interface between the first GaN portion 20 and the elemental semiconductor material portion 60 is located at the height between the first horizontal plane and the second horizontal plane. The entire area of an interface between the elemental semiconductor material portion 60 and the first GaN portion 20 is within the additional horizontal cross-sectional area that does not overlap with the horizontal cross-sectional area of the second GaN portion 40, the multi-quantum well 30, and the upper portion of the first GaN portion 20. The physical contact between the first GaN portion 20 and the elemental semiconductor material portion 60 is provided through an opening in the dielectric material liner 50.

In one embodiment, the at least one elemental semiconductor material can be deposited by selective epitaxy with epitaxial alignment with the single crystalline gallium nitride material of the first GaN portion 20. In yet another embodiment, the elemental semiconductor material portion 60 can include a single crystalline or polycrystalline silicon material, a single crystalline or polycrystalline germanium material, or a single crystalline or polycrystalline alloy of silicon and germanium. In one embodiment, the elemental semiconductor material portion 60 can consist essentially of the at least one semiconductor material, hydrogen atoms, and electrical dopant atoms. As used herein, electrical dopant atoms refer to p-type dopant atoms and/or n-type dopant atoms.

Figure 6A:
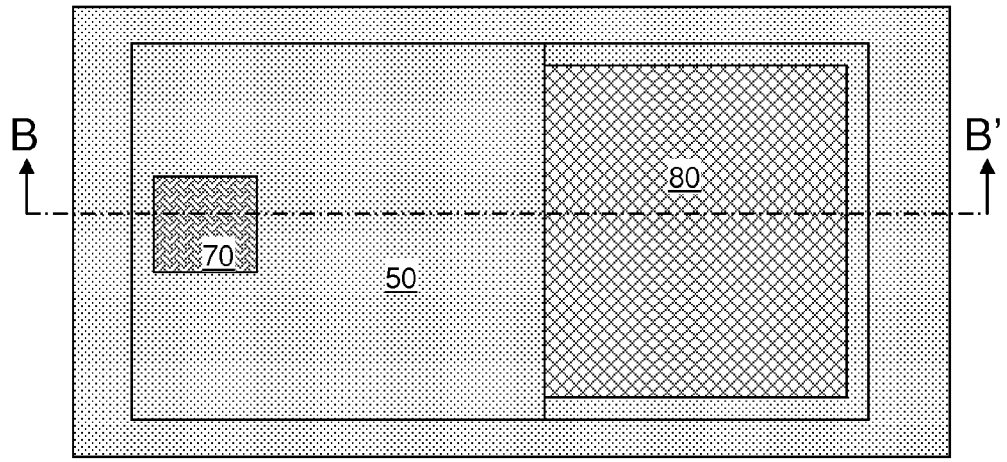
FIG. 6A is a top-down view of the first exemplary semiconductor structure after formation of contact structures on the second GaN portion and the elemental semiconductor material portion according to the first embodiment of the present disclosure.
Figure 6B:
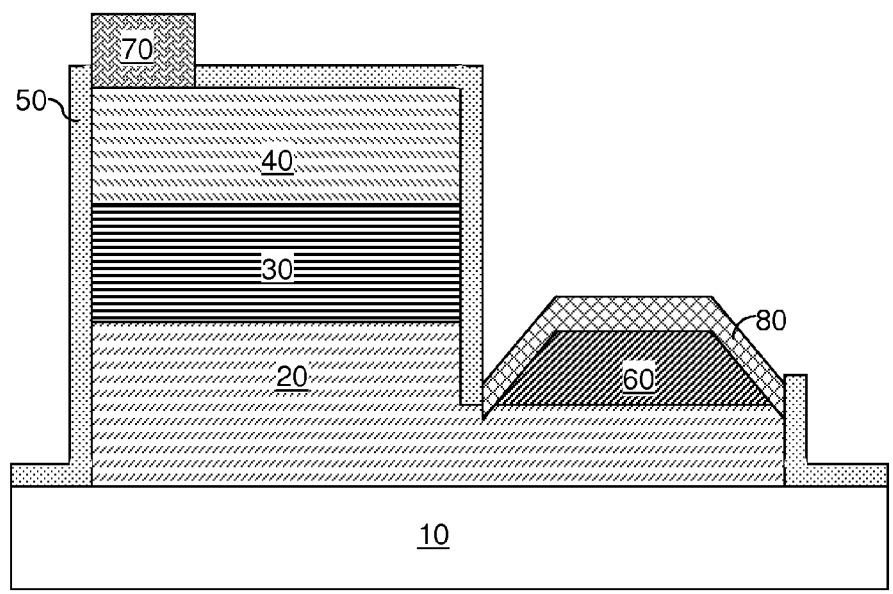
FIG. 6B is a vertical cross-sectional view of the first exemplary semiconductor structure along a vertical plane B-B' of FIG. 6A.

Referring to FIGS. 6A and 6B, contact structures are formed on the second GaN portion 40 and the elemental semiconductor material portion 60 by metallization processes. A first contact structure 80 is formed directly on the elemental semiconductor material portion 60, and a second contact structure 70 is formed directly on the second GaN portion 40. The first contact structure 80 can be formed prior to formation of the second contact structure 70, or can be formed after formation of the second contact structure 70.

For formation of the first contact structure 80, a metallic material can be deposited on the top surface of the elemental semiconductor material portion 60. The metallic material can be a material that interacts with the semiconductor material of the elemental semiconductor material portion 60 to form a metal-semiconductor alloy such as metal silicides. For example, the deposited metallic material can be nickel or a nickel alloy. The metallic material can be deposited, for example, by physical vapor deposition (PVD). The thickness of the deposited metallic material can be in a range from 3 nm to 30 nm, although lesser and greater thicknesses can also be employed. The material of the second GaN portion 40, the multi-quantum well 30, and the sidewalls of the first GaN portion 20 can be spaced from the deposited metallic material by the dielectric material liner 50.

A metallization anneal is performed at an elevated temperature to form a metal-semiconductor alloy portion directly on a top surface of the elemental semiconductor material portion 60. The metal-semiconductor alloy portion constitutes the first contact structure 80. If the elemental semiconductor material portion 60 includes a crystalline silicon-and-hydrogen-containing material, the first contact structure 80 includes an alloy of the crystalline silicon-and-hydrogen-containing material and the deposited metallic material such as nickel silicide, nickel germanide, and nickel germanosilicide. The temperature of the metallization anneal can be lower than 600° C. The hydrogen content of the elemental semiconductor material portion 60 may decrease after the metallization anneal may be in a range from 0.1 atomic percent to 20 atomic percent, although lesser and greater atomic percentages can also be employed. The thickness of the first contact structure 80 can be in a range from 5 nm to 50 nm, although lesser and greater thicknesses can also be employed.

Unreacted portion of the deposited metallic material can be removed selective to the first contact structure 80 by a wet etch. The chemistry of the wet etch is selected such that unreacted portions of the deposited metallic material can be etched selective to the metal-semiconductor alloy portions that constitutes the first contact structure 80.

The at least one elemental semiconductor material is conducive to metallization at a lower temperature than the p-doped gallium nitride material of the first GaN portion 20. As such, the at least one elemental semiconductor material of the elemental semiconductor material portion 60, which can include single crystalline or polycrystalline silicon, single crystalline or polycrystalline germanium, a single crystalline or polycrystalline silicon-germanium alloy, or a single crystalline or polycrystalline silicon-germanium-carbon alloy, can be provided with an Ohmic contact through formation of a metal silicide, a metal germanide, or a metal germanosilicide at a lower temperature than is necessary for formation of a metal-semiconductor alloy including a p-doped gallium nitride. Thus, a lower temperature anneal process can be employed to provide metallization contacts to the elemental semiconductor material portion 60 of the present disclosure compared with methods for providing metallization directly on a p-doped GaN material. Therefore, bulk diffusion in the multi-quantum well 30 in the light-emitting diode of the present disclosure can be significantly reduced relative to prior art methods.

The second contact structure 70 is formed by patterning an opening through a portion of the dielectric material liner 50 that overlies the top surface of the second GaN portion 40. Formation of the opening through the dielectric material liner 50 and physical exposure of a portion of the top surface of the second GaN portion 40 can be performed, for example, by application of a photoresist layer (not shown), lithographic patterning of the photoresist layer to form an opening overlying the second GaN portion 40, and transferring the pattern in the photoresist layer through the portion of the dielectric material liner 50 within the opening. At least one metallic material can be subsequently deposited by a directional deposition method to form the second contact structure 70. The directional deposition method can be vacuum evaporation or collimated physical vapor deposition. The at least one metallic material can include W, a combination of Ni, Pt, and Au that forms a stack, from bottom to top, of Ni/Pt/Au, a combination of Ti and Au that forms a stack, from bottom to top, of Ti/Au, a combination of Ti, Pt, and Au that forms a stack, from bottom to top, of Ti/Pt/Au, and a combination of Al and Ti that forms a stack, from bottom to top, of Al/Ti. The photoresist layer and additional metallic materials above the photoresist layer can be removed, for example, by lifting off the photoresist layer employing a solvent. An anneal may be optionally performed provided that the temperature of the anneal is not elevated to a temperature that adversely affects the band gap profile of the multi-quantum well 30 or provides bulk diffusion of the compound semiconductor materials in the multi-quantum well 30. In one embodiment, the temperature of the anneal is selected to be less than 600° C. to avoid adversely affecting the band gap profile of the multi-quantum well 30 and to avoid bulk diffusion of the compound semiconductor materials in the multi-quantum well 30. In one embodiment, the area of the second contact structure 70 is minimized in order to provide as much area for light emission from the multi-quantum well as possible while providing sufficient electrical current to the second GaN portion 40.

Figure 7A:
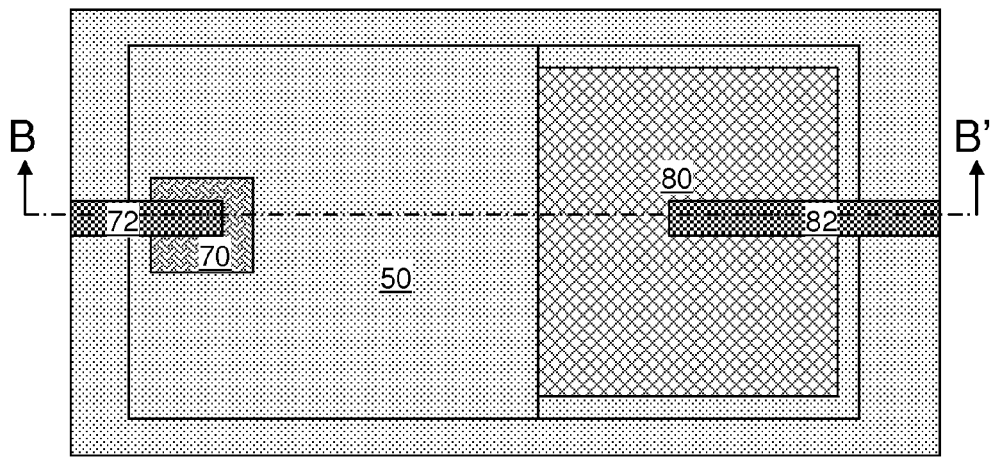
FIG. 7A is a top-down view of the first exemplary semiconductor structure after formation of contact wires according to the first embodiment of the present disclosure.
Figure 7B:
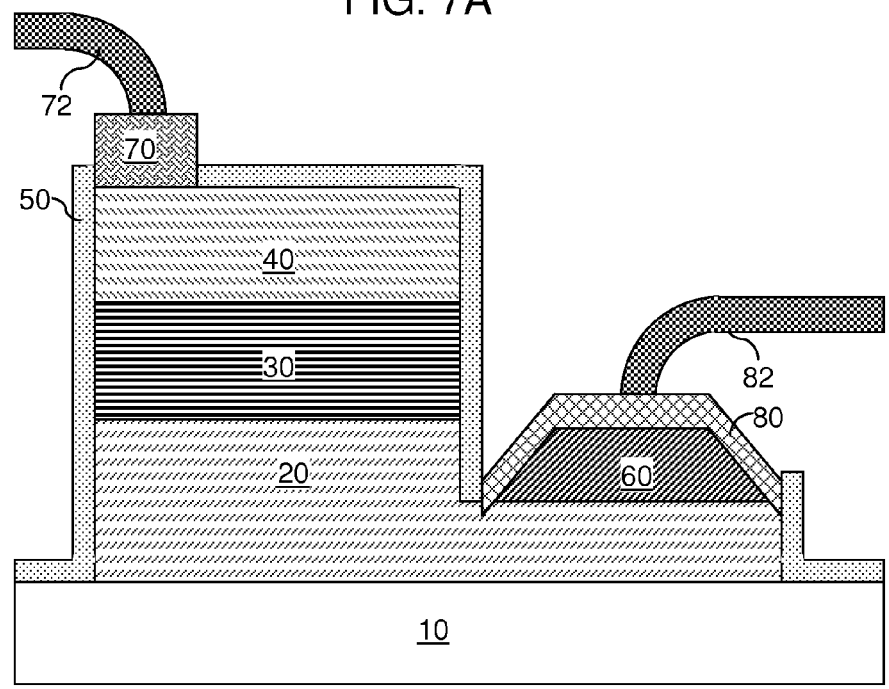
FIG. 7B is a vertical cross-sectional view of the first exemplary semiconductor structure along a vertical plane B-B' of FIG. 7A.

Referring to FIGS. 7A and 7B, electrical wiring structures can be subsequently formed on the first contact structure 80 and the second contact structure 70. The electrical wiring structures can include a first contact wire 82 attached to the first contact structure 80 and a second contact wire 72 attached to the second contact structure 70. Optionally, soldering methods can also be employed. A dielectric material layer (not shown) can be optionally formed over the first and second contact structures (80, 70). In one embodiment, contact via structures (not shown) embedded within a dielectric material layer can be employed to provide electrical contact to the first contact structure 80 and the second contact structure in lieu of the first contact wire 82 and the first contact wire 72.

Figure 8A:
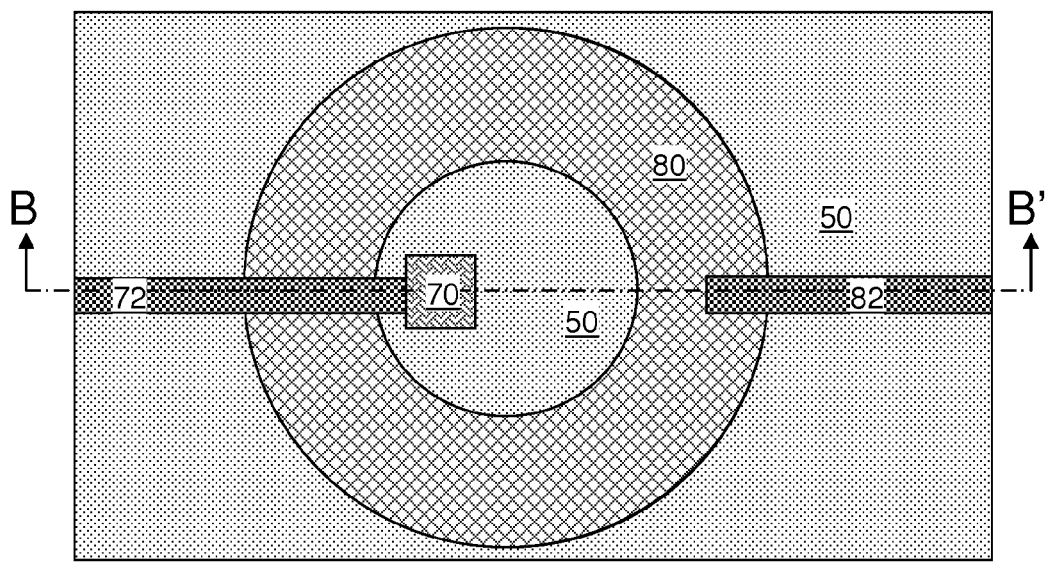
FIG. 8A is a top-down view of a variation of the first exemplary semiconductor structure according to the first embodiment of the present disclosure.
Figure 8B:
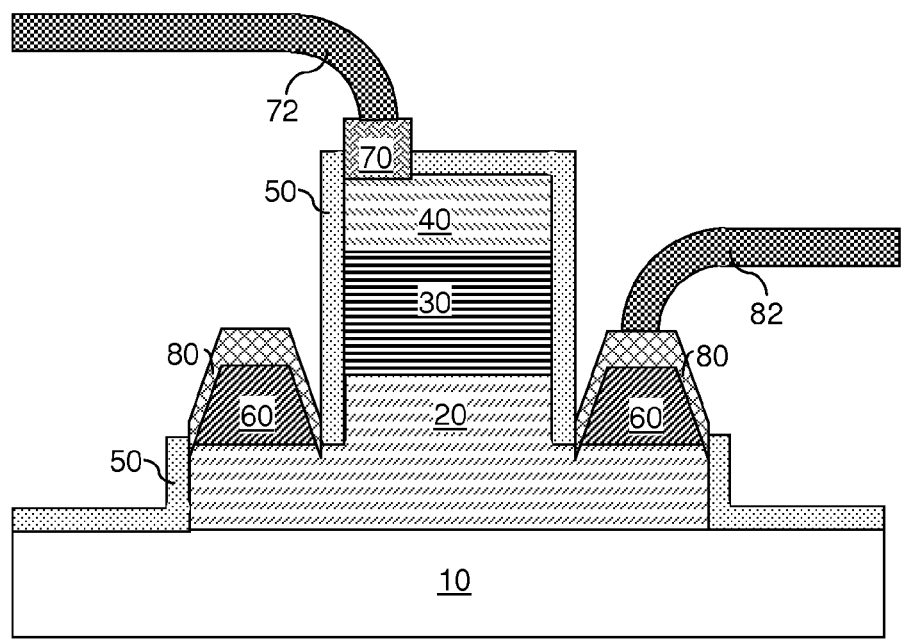
FIG. 8B is a vertical cross-sectional view of the variation of the first exemplary semiconductor structure of FIG. 8A.

Referring to FIGS. 8A and 8B, a variation of the first exemplary semiconductor structure can be derived from the first exemplary semiconductor structure by altering topology of the top surface of the first GaN portion 20 that makes contact with the elemental semiconductor material portion 60. For example, the interface at which the p-doped GaN material of the first GaN portion contacts the silicon-and-hydrogen-containing material of the elemental semiconductor material portion 60 can be ring-shaped, and the horizontal cross-sectional area of the interface can laterally enclose the horizontal cross-sectional area of the stack of the second GaN portion 40, the multi-quantum well 30, and the upper portion of the first GaN portion 20.

Figure 9A:
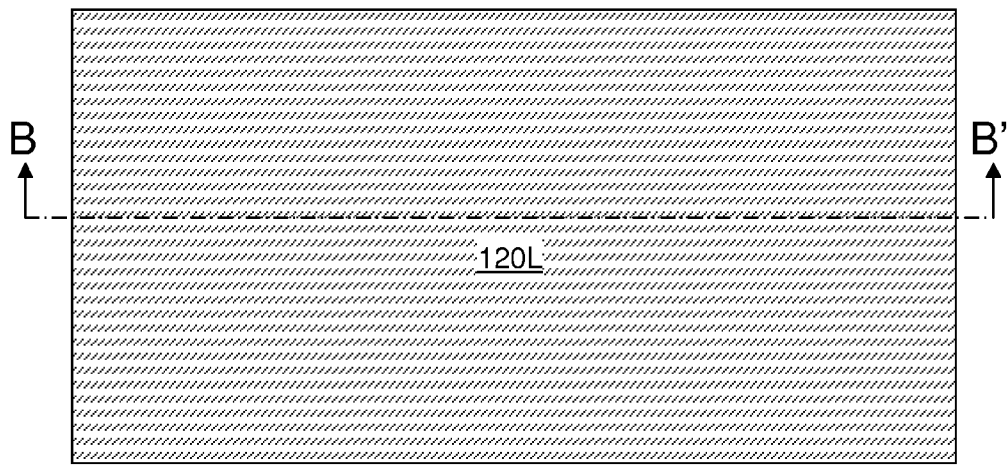
FIG. 9A is a top-down view of a second exemplary semiconductor structure after formation of a stack, from bottom to top, of a first GaN layer, a multi-quantum well layer, and a second GaN layer on a substrate according to a second embodiment of the present disclosure.
Figure 9B:
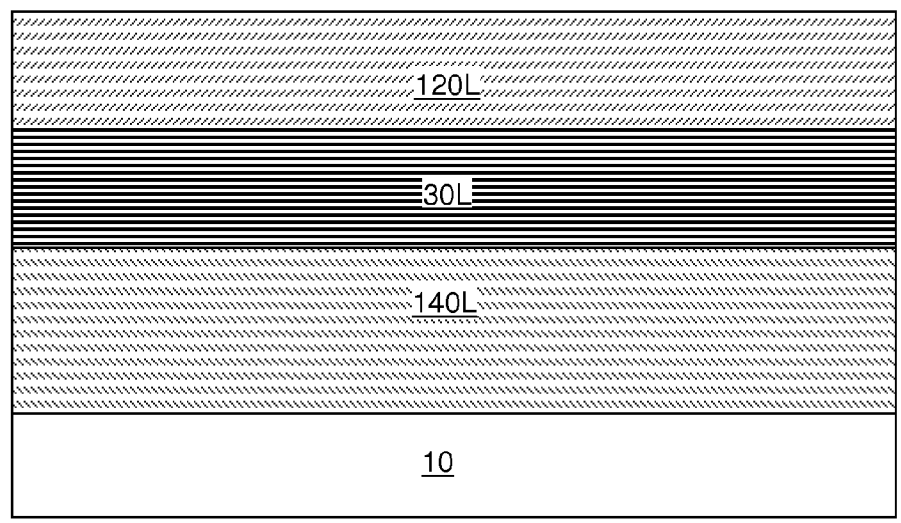
FIG. 9B is a vertical cross-sectional view of the second exemplary semiconductor structure along a vertical plane B-B' of FIG. 9A.

Referring to FIGS. 9A and 9B, a second exemplary semiconductor structure according to a second embodiment of the present disclosure includes a substrate 10 and a stack of material layers formed thereupon. The substrate 10 can be the same as in the first embodiment.

The stack of material layers can include, from bottom to top, a first GaN layer 140L, a multi-quantum well layer 30L, and a second GaN layer 120L. In one embodiment, the first GaN layer 140L, the multi-quantum well layer 30L, and the second GaN layer 120L can be single crystalline, and can be formed with epitaxial alignment to the single crystalline structure of the substrate 10. Thus, the entirety of the first GaN layer 140L, the multi-quantum well layer 30L, the second GaN layer 120L, and the substrate 10 can be single crystalline. Each of the material layers in the first GaN layer 140L, the multi-quantum well layer 30L, the second GaN layer 120L can be deposited, for example, by metalorganic chemical vapor deposition (MOCVD). Alternately, other deposition methods such as molecular beam epitaxy (MBE) may be used.

The first GaN layer 140L includes a first doped single crystalline GaN material. The type of doping of the first GaN layer 140L is herein referred to as a first conductivity type. The first conductivity type is n-type in the second embodiment. The thickness of the first GaN layer 140L can be in a range from 10 nm to 1,000 nm, although lesser and greater thicknesses can also be employed. The first GaN layer 140L can consist essentially of single crystalline GaN material and the p-type dopants therein.

The multi-quantum well layer 30L includes a one-dimensional periodic array of a bilayer unit structure, and can be the same as in the first embodiment.

The second GaN layer 120L includes a second doped single crystalline GaN material. The type of doping of the second GaN layer 120L is herein referred to as a second conductivity type. The second conductivity type is p-type in the second embodiment. The thickness of the second GaN layer 120L can be in a range from 10 nm to 1,000 nm, although lesser and greater thicknesses can also be employed. The second GaN layer 120L can consist essentially of single crystalline GaN material and the n-type dopants therein.

Figure 10A:
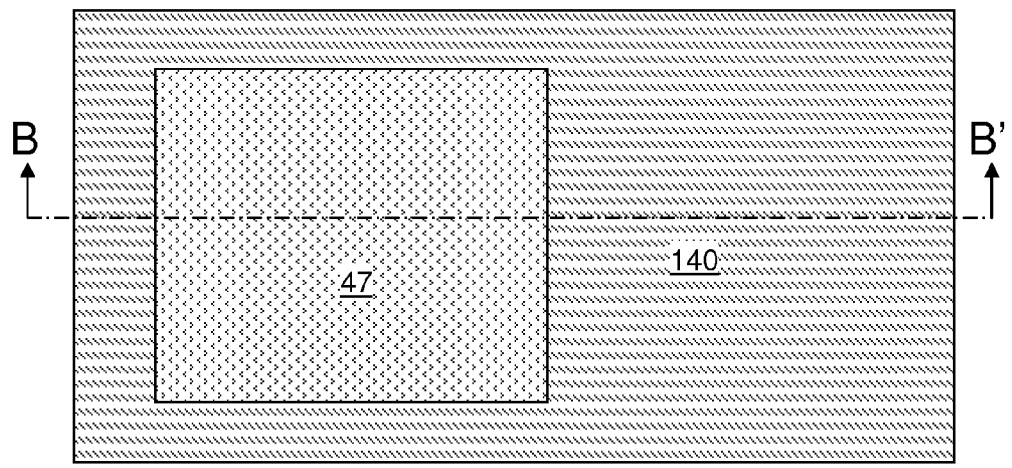
FIG. 10A is a top-down view of the second exemplary semiconductor structure after application and lithographic patterning of a photoresist layer, and transfer of the pattern into the second GaN layer, the multi-quantum well layer, and an upper portion of the first GaN layer according to the second embodiment of the present disclosure.
Figure 10B:
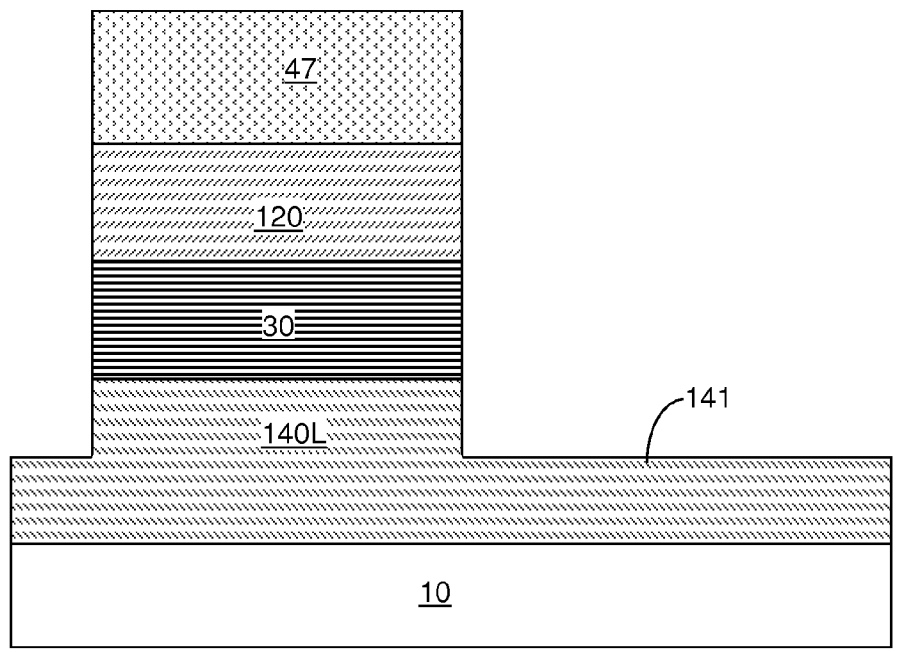
FIG. 10B is a vertical cross-sectional view of the second exemplary semiconductor structure along a vertical plane B-B' of FIG. 10A.

Referring to FIGS. 10A and 10B, a first photoresist layer 47 is applied over the top surface of the second GaN layer 120L, and is lithographically patterned to cover an area within which a stack of material portions is to be subsequently formed. The area covered by the patterned first photoresist layer 47 can be rectangular, circular, elliptical, or otherwise polygonal or of any general closed two-dimensional shape having curved and/or linear edges. The area covered by the patterned first photoresist layer 47 can be determined based on the target level of intensity for emitted light from a light-emitting diode to be subsequently formed with consideration for attenuation by blockage due to a contact structure to be subsequently formed.

The stack including the second GaN layer 120L, the multi-quantum well layer 30L, and the first GaN layer 140L is anisotropically etched down to a height between a first horizontal plane including an interface between the first GaN layer 140L and the substrate 10 and a second horizontal plane including an interface between the first GaN layer 140L and the multi-quantum well layer 30L. The anisotropic etch can be, for example, a reactive ion etch. The pattern in the first photoresist layer 47 can be transferred into the second GaN layer 120L, the multi-quantum well layer 30L, and an upper portion of the first GaN layer 140L by the anisotropic etch. The anisotropic etch can be timed, or controlled in another manner, such that the anisotropic etch stops when a recessed horizontal surface 141 of the first GaN layer 140L is between the first horizontal plane including the interface between the first GaN layer 140L and the substrate 10 and the second horizontal plane including the interface between the first GaN layer 140L and the multi-quantum well layer 30L.

A second GaN portion 120 and a multi-quantum well 30 are formed by the anisotropic etch. The second GaN portion 120 is a remaining portion of the second GaN layer 120L, and the multi-quantum well 30 is a remaining portion of the multi-quantum well layer 30L. After the anisotropic etch, the first GaN layer 140L includes an upper portion and a lower portion. The upper portion of the first GaN layer 140L, the multi-quantum well 30, and the second GaN portion 120 can have a same horizontal cross-sectional area. The upper portion of the first GaN layer 140L, the multi-quantum well 30, and the second GaN portion 120 can include sidewalls that are vertically coincident with one another. The first photoresist layer 47 is subsequently removed, for example, by ashing.

Figure 11A:
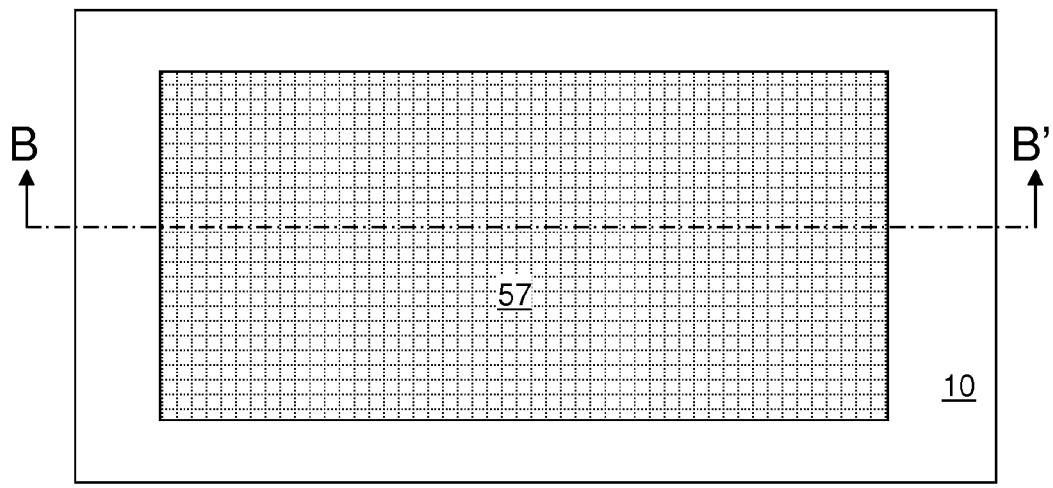
FIG. 11A is a top-down view of the second exemplary semiconductor structure after patterning a lower portion of the first GaN layer according to the second embodiment of the present disclosure.
Figure 11B:
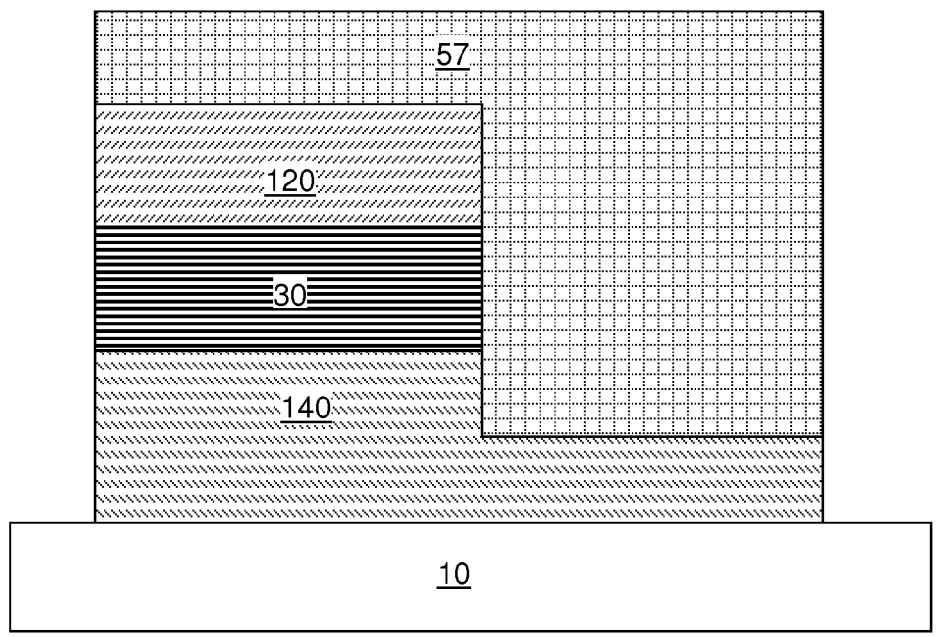
FIG. 11B is a vertical cross-sectional view of the second exemplary semiconductor structure along a vertical plane B-B' of FIG. 3A.

Referring to FIGS. 11A and 11B, a lower portion of the first GaN layer 140L is patterned. The patterning of the lower portion of the first GaN layer 140L can be performed, for example, by applying and lithographically patterning a second photoresist layer 57, and transferring the pattern in the patterned second photoresist layer 57 into the lower portion of the first GaN layer 140L by an anisotropic etch. The area covered by the patterned second photoresist layer 57 includes all of the area of the patterned first photoresist layer 47 and an additional area.

A remaining portion of the first GaN layer 140L after the anisotropic etch is herein referred to as a first GaN portion 140. The first GaN portion 140 includes an upper portion and a lower portion. The upper portion of the first GaN portion 140, the multi-quantum well 30, and the second GaN portion 120 have a same horizontal cross-sectional area. The lower portion of the first GaN portion 140 has a horizontal cross-sectional area that includes all of the same horizontal cross-sectional area and an additional horizontal cross-sectional area. Thus, the first GaN portion 140 is formed by patterning the first GaN layer 140L such that the lower portion (that is located below the horizontal plane including the recessed horizontal surface 141; See FIG. 10B) of the first GaN portion 140 has a horizontal cross-sectional area that includes all of a horizontal cross-sectional area of the upper portion (that is located above the horizontal plane including the recessed horizontal surface 141; See FIG. 10B) of the first GaN portion 140 and an additional horizontal cross-sectional area.

A vertical stack (140, 30, 120) including material portions is formed on the substrate 10. The vertical stack (140, 30, 120) includes, from bottom to top, the first GaN portion 140 having a doping of the first conductivity type, the multi-quantum well 30 located on the first GaN portion 140, and the second GaN portion 120 located on the multi-quantum well 30 and having a doping of the second conductivity type that is the opposite of the first conductivity type. The first GaN portion 140 is an n-doped GaN portion, and the second GaN portion 120 is a p-doped GaN portion. The second photoresist layer 57 is subsequently removed, for example, by ashing.

Figure 12A:
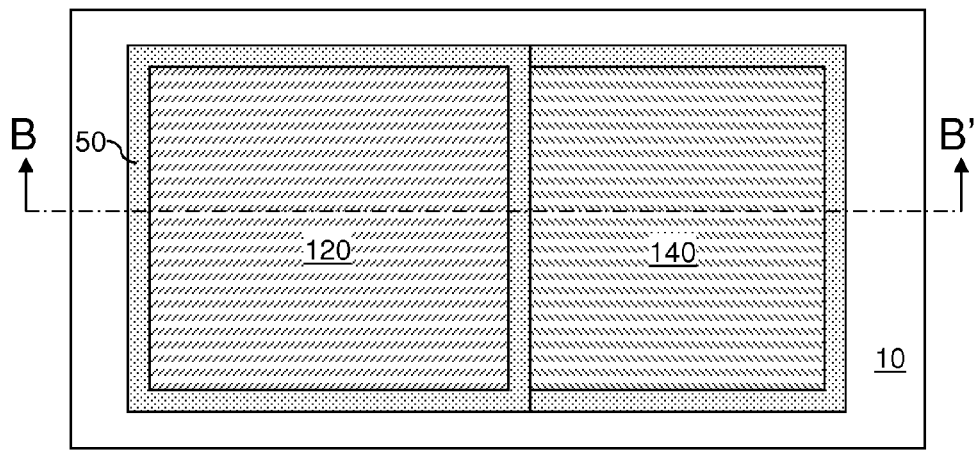
FIG. 12A is a top-down view of the second exemplary semiconductor structure after deposition and anisotropic etching of a dielectric material liner according to the second embodiment of the present disclosure.
Figure 12B:
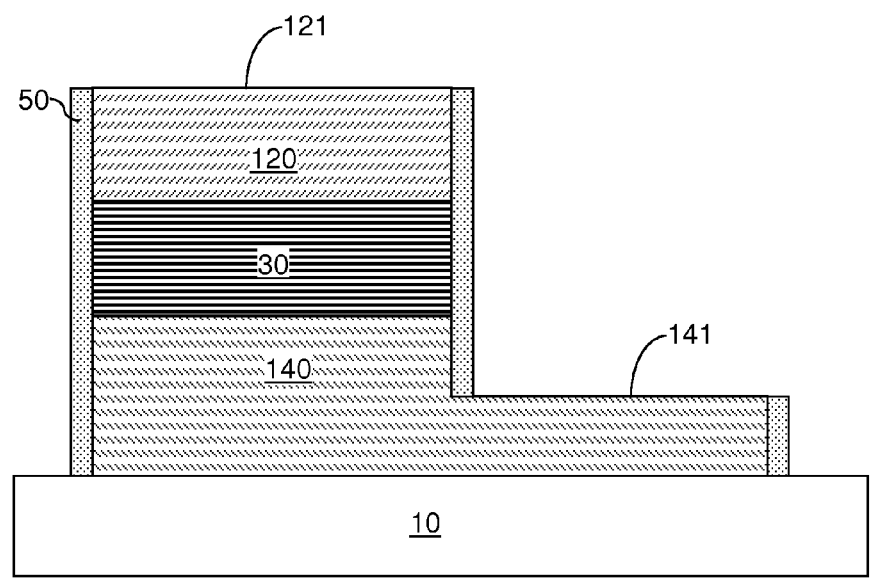
FIG. 12B is a vertical cross-sectional view of the second exemplary semiconductor structure along a vertical plane B-B' of FIG. 12A.

Referring to FIGS. 12A and 12B, a dielectric material liner 50 can be formed on physically exposed surfaces of the vertical stack (140, 30, 120) and physically exposed portions of the top surface of the substrate 10. The dielectric material liner 50 includes a dielectric material such as silicon nitride, silicon oxide, silicon oxynitride, a dielectric metal oxide, a dielectric metal nitride, a dielectric metal oxynitride, or a combination thereof. The dielectric material liner 50 can be deposited, for example, by chemical vapor deposition (CVD) or atomic layer deposition (ALD). The dielectric material liner 50 can be deposited conformally, i.e., such that horizontal portions and vertical portions of the dielectric material liner 50 have substantially the same thickness. The thickness of the dielectric material liner 50, as measured on sidewalls of the vertical stack (140, 30, 120) can be in a range from 3 nm to 100 nm, although lesser and greater thicknesses can also be employed.

Horizontal portions of the dielectric material liner 50 can be subsequently removed by an anisotropic etch such as a reactive ion etch to physically expose various horizontal surfaces. The physically exposed horizontal surfaces include the recessed horizontal surface 141 of the first GaN portion 140, a top surface 121 of the second GaN portion 120, and portions of the top surface of the substrate 10. The remaining portions of the dielectric material liner 50 constitute a dielectric spacer that laterally surrounds the vertical stack (140, 30, 120).

Figure 13A:
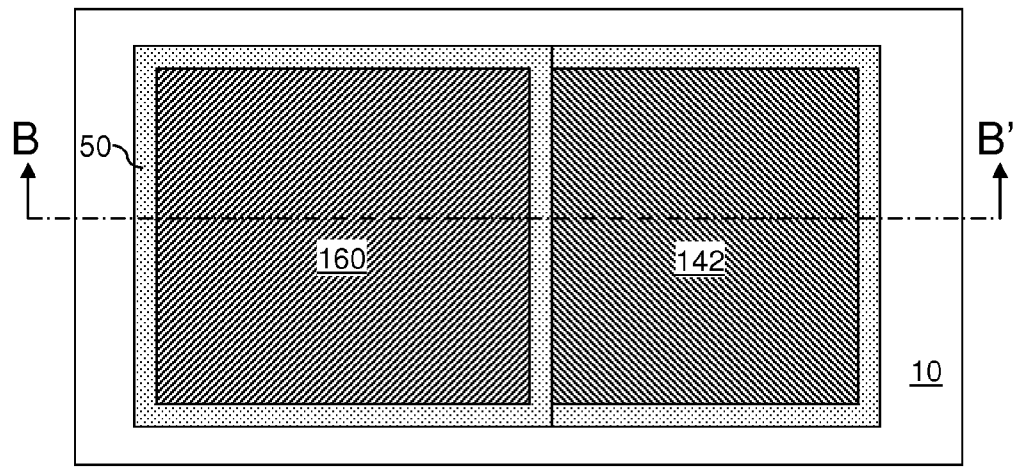
FIG. 13A is a top-down view of the second exemplary semiconductor structure after formation of elemental semiconductor material portions on a first GaN portion and on a second GaN portion according to the second embodiment of the present disclosure.
Figure 13B:
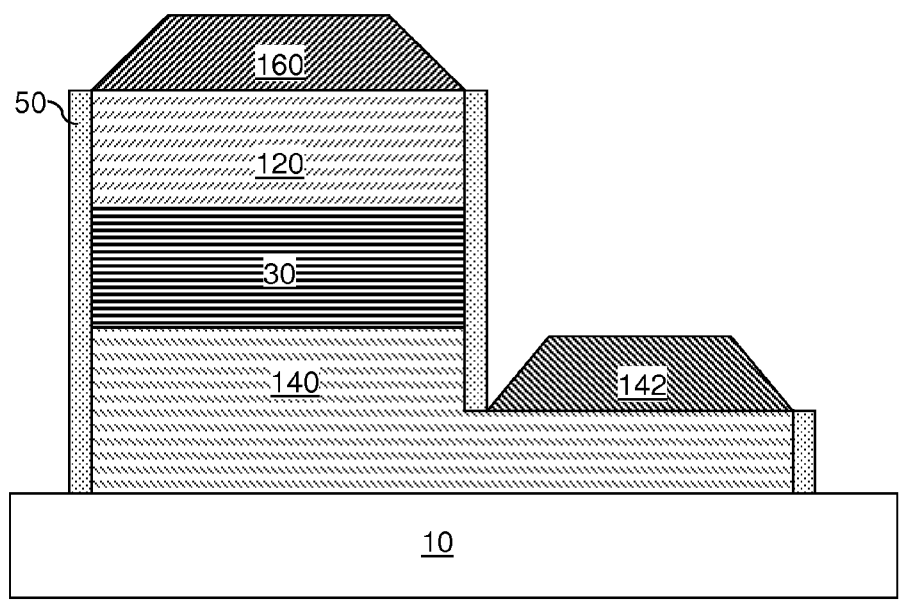
FIG. 13B is a vertical cross-sectional view of the second exemplary semiconductor structure along a vertical plane B-B' of FIG. 13A.

Referring to FIGS. 13A and 13B, at east one elemental semiconductor material is deposited on the physically exposed surface of the first GaN portion 140 and the physically exposed surface of the second GaN portion 120 by a selective deposition process. In other words, the at least one elemental semiconductor material is deposited directly on the recessed horizontal surface 141 of the first GaN portion 140, and directly on the top surface 121 of the second GaN portion 120. The at least one elemental semiconductor material can be deposited on crystalline surfaces that include physically exposed semiconductor surfaces, while not being deposited on amorphous surfaces such as dielectric surfaces or metallic surfaces. A first elemental semiconductor material portion 142 including the deposited at least one elemental semiconductor material is formed directly on the physically exposed surface of the first GaN portion 140. A second elemental semiconductor material portion 160 including a portion of the deposited at least one elemental semiconductor material is formed directly on the physically exposed surface of the second GaN portion 120.

The elemental semiconductor material can be silicon, germanium, and carbon. The at least one elemental semiconductor material can include a single elemental semiconductor element, or can include an alloy of at least two elemental semiconductor elements. Thus, the at least one elemental semiconductor material as deposited can be elemental silicon, elemental germanium, a silicon-germanium alloy, a silicon-carbon alloy, or a silicon-germanium-carbon alloy. The at least one elemental semiconductor material in the first and second elemental semiconductor material portions (142, 160) can be intrinsic, or can be doped with p-type dopants such as B, Ga, or In, or can be doped with n-type dopants such as P, As, or Sb.

In one embodiment, at least one masked ion implantation can be performed to change the conductivity type(s) of the first elemental semiconductor material portions 142 and/or the second elemental semiconductor material portion 160. In this case, sufficient electrical dopants (i.e., p-type dopants and/or n-type dopants) can be implanted into the first elemental semiconductor material portions 142 and/or the second elemental semiconductor material portion 160 so that the net doping of the first elemental semiconductor material portions 142 is n-type and the net doping of the second elemental semiconductor material portion 160 is p-type.

In an exemplary embodiment, the at least one elemental semiconductor material can be a crystalline silicon-and-hydrogen-containing material. The crystalline silicon-and-hydrogen-containing material includes silicon and hydrogen, and can be single-crystalline or polycrystalline. Thus, the first and second elemental semiconductor material portions (142, 160) can include the crystalline silicon-and-hydrogen-containing material. The crystalline silicon-and-hydrogen-containing material can have the same composition as in the first embodiment, and can be formed by employing the same processing steps.

Thus, the first and second elemental semiconductor material portions (142, 160) can be formed by selectively depositing the at least one elemental semiconductor material on the physically exposed surfaces of the first GaN portion 140 and the second GaN portion 120. A bottom surface of the first elemental semiconductor material portion 142 can be in contact with the single crystalline n-doped gallium nitride material of the first GaN portion 140. The first elemental semiconductor material portion 142 contacts a horizontal surface (e.g., the recessed horizontal surface 141 illustrated in FIG. 12B) of the first GaN portion 140 such that the horizontal surface is located between the first horizontal plane including the interface between the first GaN portion 140 and the substrate 10 and the second horizontal plane including the interface between the first GaN portion 140 and the multi-quantum well 30. In other words, the height of the horizontal surface of the interface between the first GaN portion 140 and the first elemental semiconductor material portion 142 is located at the height between the first horizontal plane and the second horizontal plane. The entire area of an interface between the first elemental semiconductor material portion 142 and the first GaN portion 140 is within the additional horizontal cross-sectional area that does not overlap with the horizontal cross-sectional area of the second GaN portion 120, the multi-quantum well 30, and the upper portion of the first GaN portion 140. The physical contact between the first GaN portion 140 and the first elemental semiconductor material portion 142 is provided through an opening in the dielectric material liner 50.

A bottom surface of the second elemental semiconductor material portion 160 can be in contact with the single crystalline p-doped gallium nitride material of the second GaN portion 120. The second elemental semiconductor material portion 160 contacts a horizontal top surface (e.g., the top surface 121 illustrated in FIG. 12B) of the second GaN portion 120. The entire area of an interface between the second elemental semiconductor material portion 160 and the second GaN portion 120 can be the same as the horizontal cross-sectional area of the stack of the second GaN portion 120, the multi-quantum well 30, and the upper portion of the first GaN portion 140. The physical contact between the second GaN portion 120 and the second elemental semiconductor material portion 160 is provided through an opening in the dielectric material liner 50.

In one embodiment, the at least one elemental semiconductor material can be deposited by selective epitaxy with epitaxial alignment with the single crystalline gallium nitride materials of the first GaN portion 140 and the second GaN portion 120. In yet another embodiment, the first and second elemental semiconductor material portions (142, 160) can include a single crystalline or polycrystalline silicon material, a single crystalline or polycrystalline germanium material, or a single crystalline or polycrystalline alloy of silicon and germanium. In one embodiment, the first and second elemental semiconductor material portions (142, 160) can consist essentially of the at least one semiconductor material, hydrogen atoms, and electrical dopant atoms. As used herein, electrical dopant atoms refer to p-type dopant atoms and/or n-type dopant atoms.

Figure 14A:
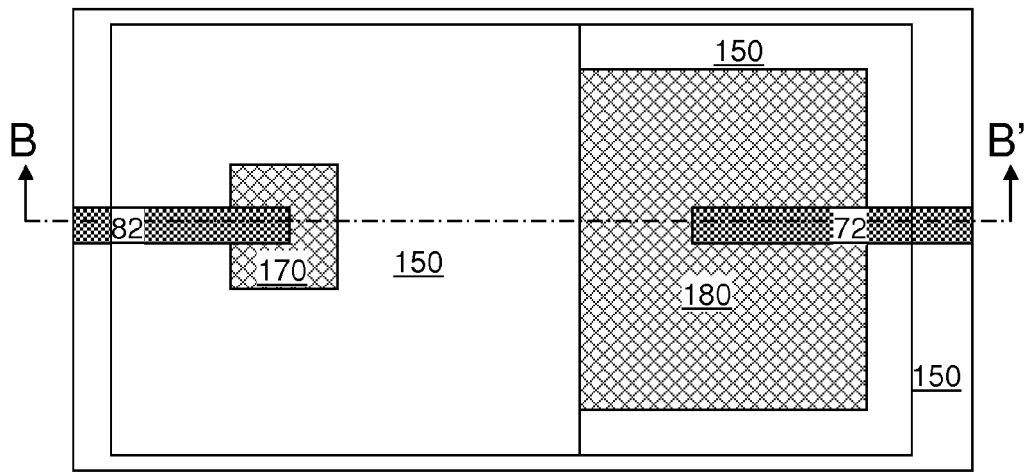
FIG. 14A is a top-down view of the second exemplary semiconductor structure after formation of contact structures and contact wires according to the second embodiment of the present disclosure.
Figure 14B:
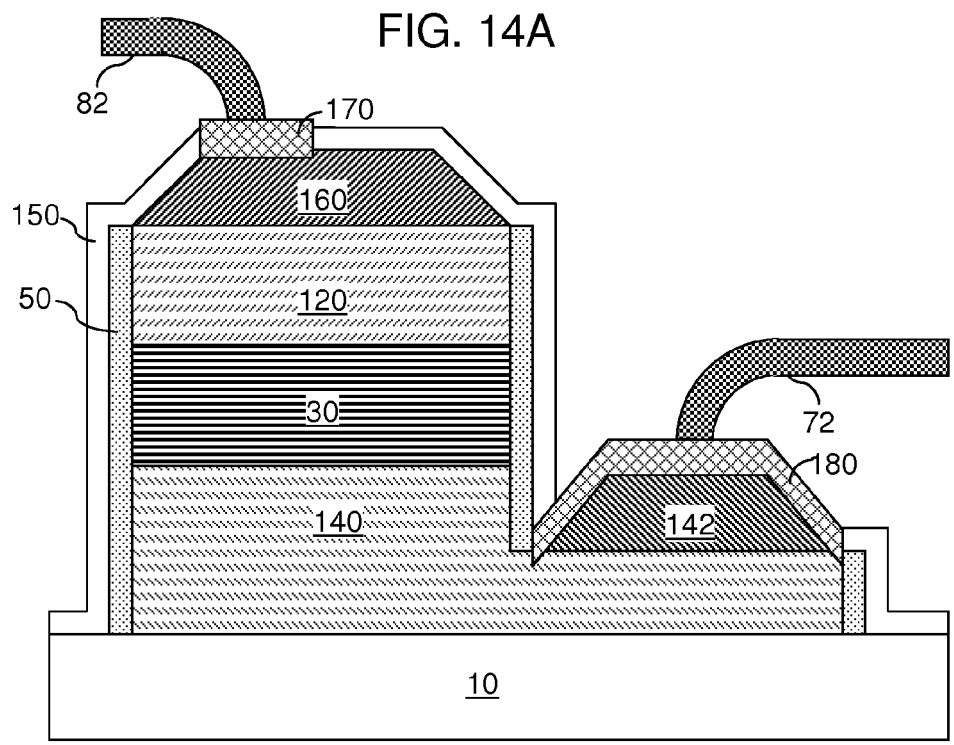
FIG. 14B is a vertical cross-sectional view of the second exemplary semiconductor structure along a vertical plane B-B' of FIG. 14A.

Referring to FIGS. 14A and 14B, contact structures are formed on the first and second elemental semiconductor material portions (142, 160) by metallization processes. A first contact structure 180 is formed directly on the first elemental semiconductor material portion 142, and a second contact structure 170 is formed directly on a portion of the top surface of the second elemental semiconductor material portion 160. The first contact structure 180 can be formed prior to formation of the second contact structure 170, or can be formed after formation of the second contact structure 170, or can be concurrent with formation of the second contact structure 170.

For example, a second dielectric material liner 150 can be deposited over the first exemplary semiconductor structure by a conformal deposition method, and is patterned to provide a first opening over the first elemental semiconductor material portion 142 and a second opening over the second elemental semiconductor material portion 160. In one embodiment, the area of the first opening can be substantially the same as the area of the first elemental semiconductor material portion 142, and the area of the second opening can be minimized in order to provide as much area for light emission from the multi-quantum well 30 as possible while providing sufficient electrical current to the second GaN portion 120.

A metallic material can be deposited on the top surface of the first and second elemental semiconductor material portions (142, 160). The metallic material can be a material that interacts with the semiconductor material of the first and second elemental semiconductor material portions (142, 160) to form a metal-semiconductor alloy such as metal silicides. For example, the deposited metallic material can be nickel or a nickel alloy. The metallic material can be deposited, for example, by physical vapor deposition (PVD). The thickness of the deposited metallic material can be in a range from 3 nm to 30 nm, although lesser and greater thicknesses can also be employed.

A metallization anneal is performed at an elevated temperature to form metal-semiconductor alloy portions directly on physically exposed surface of the first and second elemental semiconductor material portions (142, 160). The metal-semiconductor alloy portion formed directly on the first elemental semiconductor material portion 142 constitutes the first contact structure 180. The metal-semiconductor alloy portion formed directly on the second elemental semiconductor material portion 160 constitutes the second contact structure 170. If the first and second elemental semiconductor material portions (142, 160) include a crystalline silicon-and-hydrogen-containing material, the first contact structure 180 and the second contact structure 170 include an alloy of the crystalline silicon-and-hydrogen-containing material and the deposited metallic material such as nickel silicide, nickel germanide, and nickel germanosilicide. The temperature of the metallization anneal can be lower than 600° C. The hydrogen content of the first and second elemental semiconductor material portions (142, 160) may decrease after the metallization anneal may be in a range from 0.1 atomic percent to 20 atomic percent, although lesser and greater atomic percentages can also be employed. The thickness of the first contact structure 180 and the second contact structure 170 can be in a range from 5 nm to 50 nm, although lesser and greater thicknesses can also be employed.

Unreacted portion of the deposited metallic material can be removed selective to the first contact structure 180 and the second contact structure 170 by a wet etch. The chemistry of the wet etch is selected such that unreacted portions of the deposited metallic material can be etched selective to the metal-semiconductor alloy portions that constitutes the first contact structure 180 and the second contact structure 170.

The at least one elemental semiconductor material is conducive to metallization at a lower temperature than the p-doped gallium nitride material of the second GaN portion 120. As such, the at least one elemental semiconductor material of the second elemental semiconductor material portion 160, which can include single crystalline or polycrystalline silicon, single crystalline or polycrystalline germanium, a single crystalline or polycrystalline silicon-germanium alloy, or a single crystalline or polycrystalline silicon-germanium-carbon alloy, can be provided with an Ohmic contact through formation of a metal silicide, a metal germanide, or a metal germanosilicide at a lower temperature than is necessary for formation of a metal-semiconductor alloy including a p-doped gallium nitride. Thus, a lower temperature anneal process can be employed to provide metallization contacts to the second elemental semiconductor material portion 160 of the present disclosure compared with methods for providing metallization directly on a p-doped GaN material. Therefore, bulk diffusion in the multi-quantum well 30 in the light-emitting diode of the present disclosure can be significantly reduced relative to prior art methods.

Subsequently, electrical wiring structures can be formed on the first contact structure 180 and the second contact structure 170 in the same manner as in the first embodiment.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A semiconductor structure comprising:
a vertical stack located on a substrate, said vertical stack comprising, from bottom to top:
a first GaN portion having a doping of a first conductivity type,
a multi-quantum well located on said first GaN portion, and
a second GaN portion located on said multi-quantum well and having a doping of
a second conductivity type that is the opposite of said first conductivity type,
wherein one of said first and second GaN portions is a p-doped GaN portion having a single crystalline structure; and
an elemental semiconductor material portion comprising at least one elemental semiconductor material and in contact with a surface of said p-doped GaN portion, said elemental semiconductor material portion being single crystalline and in epitaxial alignment with said single crystalline structure of said p-doped GaN portion.

2. The semiconductor structure of claim 1, wherein said multi-quantum well comprises a one-dimensional periodic array of a bilayer unit structure, said bilayer bilaryer unit structure comprising a first compound semiconductor material and a second compound semiconductor material.

3. The semiconductor structure of claim 2, wherein said first compound semiconductor material is selected from $In_xGa_{1-x}N$, $Al_xGa_{1-x}N$, and $In_xAl_yGa_{1-x-y}N$, and said second compound semiconductor material is selected from GaN, $In_uGa_{1-u}N$, $Al_uGa_{1-u}N$, and $In_uAl_vGa_{1-u-v}N$, wherein said first and second compound semiconductor materials have different compositions, and said x, said y, said u, and said v are independently selected numbers greater than 0 and less than 1, and each of a sum of said x and said y and a sum of said u and said v is greater than 0 and less than 1.

4. The semiconductor structure of claim 1, wherein first GaN portion, said multi-quantum well, and said second GaN portion are single crystalline, and are epitaxially aligned among one another.

5. The semiconductor structure of claim 1, wherein said first GaN portion includes an upper portion and a lower portion, wherein said upper portion, said multi-quantum well, and said second GaN portion have a same horizontal cross-sectional area.

6. The semiconductor structure of claim 5, wherein said lower portion has a horizontal cross-sectional area that includes all of said same horizontal cross-sectional area and an additional horizontal cross-sectional area.

7. The semiconductor structure of claim 6, wherein an entire area of an interface between said elemental semiconductor material portion and said first GaN portion is within said additional horizontal cross-sectional area.

8. The semiconductor structure of claim 5, wherein said p-doped GaN portion is said first GaN portion, and said elemental semiconductor material portion contacts a horizontal surface of said first GaN portion, wherein said horizontal surface is located between a first horizontal plane including an interface between said first GaN portion and said substrate and a second horizontal plane including an interface between said first GaN portion and said multi-quantum well.

9. The semiconductor structure of claim 1, wherein said p-doped GaN portion is said second GaN portion, and said elemental semiconductor material portion is in contact with a top surface of said second GaN portion.

10. The semiconductor structure of claim 1, further comprising a dielectric material liner laterally surrounding said vertical stack and including an opening through which said elemental semiconductor material portion contacts said p-doped GaN portion.

11. The semiconductor structure of claim 1, wherein said elemental semiconductor material portion comprises a single crystalline or polycrystalline silicon material, a single crystalline or polycrystalline germanium material, or a single crystalline or polycrystalline alloy of silicon and germanium.

12. The semiconductor structure of claim 1, wherein said elemental semiconductor material portion comprises a crystalline silicon-and-hydrogen-containing material.

13. The semiconductor structure of claim 1, wherein said elemental semiconductor material portion is a p-doped single crystalline elemental semiconductor material portion.

14. The semiconductor structure of claim 13, wherein said p-doped single crystalline elemental semiconductor material portion comprises a material selected from p-doped single crystalline silicon, p-doped single crystalline germanium, a p-doped single crystalline silicon-germanium alloy, a p-doped single crystalline silicon-carbon alloy, or a p-doped single crystalline silicon-germanium-carbon alloy.

15. The semiconductor structure of claim 13, further comprising a contact structure located on said elemental semiconductor material portion and containing a metal-semiconductor alloy of at least one elemental semiconductor material and a metal.

16. The semiconductor structure of claim 15, further comprising another contact structure located on another of said first and second GaN portions is a p-doped GaN portion and having a different composition than said contact structure.

17. The semiconductor structure of claim 16, wherein said another contact structure comprises at least one of W, Au, and Al.

18. The semiconductor structure of claim 17, wherein said metal-semiconductor alloy is an alloy of said at least one elemental semiconductor material and nickel.

* * * * *